(12) United States Patent
Asami et al.

(10) Patent No.: US 8,994,009 B2
(45) Date of Patent: Mar. 31, 2015

(54) PHOTOELECTRIC CONVERSION DEVICE

(75) Inventors: Yoshinobu Asami, Kanagawa (JP); Riho Kataishi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 22 days.

(21) Appl. No.: 13/602,352

(22) Filed: Sep. 4, 2012

(65) Prior Publication Data

US 2013/0056715 A1 Mar. 7, 2013

(30) Foreign Application Priority Data

Sep. 7, 2011 (JP) ................................. 2011-195372

(51) Int. Cl.
*H01L 51/00* (2006.01)
*H01L 31/0216* (2014.01)

(52) U.S. Cl.
CPC ......... *H01L 31/02167* (2013.01); *Y02E 10/549* (2013.01)
USPC .......................................................... 257/40

(58) Field of Classification Search
CPC ................. H01L 31/022433; H01L 31/02363; H01L 31/075; H01L 31/202; H01L 31/035281
USPC .................... 257/40, 88, 98, E31.04, 103, 615
See application file for complete search history.

(56) References Cited

U.S. PATENT DOCUMENTS

| | | | |
|---|---|---|---|
| 4,180,618 A | 12/1979 | Alpha et al. | |
| 4,272,641 A | 6/1981 | Hanak | |
| 4,316,049 A | 2/1982 | Hanak | |
| 4,385,199 A | 5/1983 | Hamakawa et al. | |
| 4,385,200 A | 5/1983 | Hamakawa et al. | |
| 4,388,482 A | 6/1983 | Hamakawa et al. | |
| 4,430,405 A | 2/1984 | Ono et al. | |
| 4,496,788 A | 1/1985 | Hamakawa et al. | |
| 4,510,344 A | 4/1985 | Berman | |

(Continued)

FOREIGN PATENT DOCUMENTS

| | | |
|---|---|---|
| JP | 55-120181 | 9/1980 |
| JP | 59-124772 | 7/1984 |

(Continued)

OTHER PUBLICATIONS

Tang C, "Two-Layer Organic Photovoltaic Cell,", Appl. Phys. Lett. (Applied Physics Letters), Jan. 13, 1986, vol. 48, No. 2, pp. 183-185.

(Continued)

*Primary Examiner* — Yu-Hsi D Sun
*Assistant Examiner* — Christina Sylvia
(74) *Attorney, Agent, or Firm* — Nixon Peabody LLP; Jeffrey L. Costellia (57) ABSTRACT

To provide a photoelectric conversion device which has little light loss caused by light absorption in a window layer, the photoelectric conversion device includes a first electrode, a first semiconductor layer formed over the first electrode, a second semiconductor layer formed over the first semiconductor layer, a third semiconductor layer formed over the second semiconductor layer, and a second electrode formed over the third semiconductor layer; and the first semiconductor layer is a light-transmitting semiconductor layer containing an organic compound and an inorganic compound, and the second semiconductor layer and the third semiconductor layer are each a semiconductor layer containing an organic compound.

10 Claims, 4 Drawing Sheets

(56) References Cited

U.S. PATENT DOCUMENTS

| | | | |
|---|---|---|---|
| 4,633,034 A | 12/1986 | Nath et al. |
| 4,665,277 A | 5/1987 | Sah et al. |
| 4,680,422 A | 7/1987 | Stanbery |
| 4,684,761 A | 8/1987 | Devaney |
| 4,740,431 A | 4/1988 | Little |
| 4,768,072 A | 8/1988 | Seki et al. |
| 4,878,097 A | 10/1989 | Yamazaki |
| 4,926,229 A | 5/1990 | Nakagawa et al. |
| 4,927,721 A | 5/1990 | Gratzel et al. |
| 4,950,614 A | 8/1990 | Yamazaki |
| 4,954,856 A | 9/1990 | Yamazaki |
| 4,959,106 A | 9/1990 | Nakagawa et al. |
| 4,971,919 A | 11/1990 | Yamazaki |
| 5,002,617 A | 3/1991 | Kanai et al. |
| 5,002,618 A | 3/1991 | Kanai et al. |
| 5,006,180 A | 4/1991 | Kanai et al. |
| 5,024,706 A | 6/1991 | Kanai et al. |
| 5,045,482 A | 9/1991 | Yamazaki |
| 5,061,979 A | 10/1991 | Kobayashi et al. |
| 5,084,365 A | 1/1992 | Gratzel et al. |
| 5,213,628 A | 5/1993 | Noguchi et al. |
| 5,243,216 A | 9/1993 | Noguchi et al. |
| 5,259,891 A | 11/1993 | Matsuyama et al. |
| 5,328,519 A | 7/1994 | Kawakami |
| 5,352,614 A | 10/1994 | Yamanove |
| 5,370,747 A | 12/1994 | Noguchi et al. |
| 5,371,037 A | 12/1994 | Yonehara |
| 5,417,770 A | 5/1995 | Saitoh et al. |
| 5,439,533 A | 8/1995 | Saito et al. |
| 5,478,777 A | 12/1995 | Yamazaki |
| 5,482,570 A | 1/1996 | Saurer et al. |
| 5,527,396 A | 6/1996 | Saitoh et al. |
| 5,536,333 A | 7/1996 | Foote et al. |
| 5,571,749 A | 11/1996 | Matsuda et al. |
| 5,580,820 A | 12/1996 | Yamazaki |
| 5,635,408 A | 6/1997 | Sano et al. |
| 5,656,098 A | 8/1997 | Ishikawa et al. |
| 5,665,607 A | 9/1997 | Kawama et al. |
| 5,668,050 A | 9/1997 | Iwasaki |
| 5,676,765 A | 10/1997 | Saito et al. |
| 5,700,333 A | 12/1997 | Yamazaki et al. |
| 5,720,827 A | 2/1998 | Simmons |
| 5,735,949 A | 4/1998 | Mantl et al. |
| 5,736,431 A | 4/1998 | Shinohara et al. |
| 5,738,731 A | 4/1998 | Shindo et al. |
| 5,750,000 A | 5/1998 | Yonehara et al. |
| 5,780,160 A | 7/1998 | Allemand et al. |
| 5,783,292 A | 7/1998 | Tokito et al. |
| 5,811,348 A | 9/1998 | Matsushita et al. |
| 5,840,616 A | 11/1998 | Sakaguchi et al. |
| 5,961,743 A | 10/1999 | Yamazaki et al. |
| 5,985,689 A | 11/1999 | Gofuku et al. |
| 5,989,737 A | 11/1999 | Xie et al. |
| 6,023,020 A | 2/2000 | Nishitani et al. |
| 6,077,722 A | 6/2000 | Jansen et al. |
| 6,091,382 A | 7/2000 | Shioya et al. |
| 6,100,465 A | 8/2000 | Shinohara et al. |
| 6,133,119 A | 10/2000 | Yamazaki |
| 6,190,937 B1 | 2/2001 | Nakagawa et al. |
| 6,191,353 B1 | 2/2001 | Shiotsuka et al. |
| 6,207,284 B1 | 3/2001 | Varanasi et al. |
| 6,255,774 B1 * | 7/2001 | Pichler ............... 313/504 |
| 6,259,016 B1 | 7/2001 | Negami et al. |
| 6,310,282 B1 | 10/2001 | Sakurai et al. |
| 6,331,208 B1 | 12/2001 | Nishida et al. |
| 6,340,781 B1 | 1/2002 | Shields et al. |
| 6,428,912 B1 | 8/2002 | Haddon |
| 6,468,884 B2 | 10/2002 | Miyake et al. |
| 6,486,041 B2 | 11/2002 | Henley et al. |
| 6,486,601 B1 | 11/2002 | Sakai et al. |
| 6,534,704 B2 | 3/2003 | Hashimoto et al. |
| 6,566,277 B1 | 5/2003 | Nakagawa et al. |
| 6,589,673 B1 | 7/2003 | Kido et al. |
| 6,653,701 B1 | 11/2003 | Yamazaki et al. |
| 6,683,244 B2 | 1/2004 | Fujimori et al. |
| 6,692,981 B2 | 2/2004 | Takato et al. |
| 6,756,289 B1 | 6/2004 | Nakagawa et al. |
| 6,818,529 B2 | 11/2004 | Bachrach et al. |
| 6,830,778 B1 | 12/2004 | Schulz et al. |
| 6,835,888 B2 | 12/2004 | Sano et al. |
| 6,930,025 B2 | 8/2005 | Nakayama et al. |
| 7,052,998 B2 | 5/2006 | Shinohara |
| 7,075,002 B1 | 7/2006 | Yamazaki et al. |
| 7,158,161 B2 | 1/2007 | Gyoutoku et al. |
| 7,235,131 B2 | 6/2007 | Nishinaga |
| 7,288,887 B2 | 10/2007 | Aziz et al. |
| 7,291,782 B2 | 11/2007 | Sager et al. |
| 7,420,226 B2 | 9/2008 | Augustine et al. |
| 7,435,634 B2 | 10/2008 | Kim et al. |
| 7,517,470 B2 | 4/2009 | Seo et al. |
| 7,572,522 B2 | 8/2009 | Seo et al. |
| 7,579,089 B2 | 8/2009 | Seo et al. |
| 7,626,198 B2 | 12/2009 | Hirakata et al. |
| 7,674,647 B2 | 3/2010 | Arai |
| 7,732,808 B2 | 6/2010 | Ikeda et al. |
| 7,750,425 B2 | 7/2010 | Forrest et al. |
| 7,759,220 B2 | 7/2010 | Henley |
| 7,772,485 B2 | 8/2010 | Gaudiana et al. |
| 7,781,673 B2 | 8/2010 | Gaudiana et al. |
| 7,858,431 B2 | 12/2010 | Isaka et al. |
| 7,871,849 B2 | 1/2011 | Arai |
| 7,902,453 B2 | 3/2011 | Dutta |
| 7,915,611 B2 | 3/2011 | Yamazaki et al. |
| 7,964,429 B2 | 6/2011 | Yamazaki et al. |
| 7,985,604 B2 | 7/2011 | Isaka et al. |
| 7,989,694 B2 | 8/2011 | Iwaki |
| 8,044,296 B2 | 10/2011 | Yamazaki et al. |
| 8,080,934 B2 | 12/2011 | Kido et al. |
| 8,093,590 B2 | 1/2012 | Yamazaki et al. |
| 8,101,857 B2 | 1/2012 | Kido et al. |
| 8,143,087 B2 | 3/2012 | Isaka et al. |
| 8,310,147 B2 | 11/2012 | Seo et al. |
| 2001/0017153 A1 | 8/2001 | Kubota et al. |
| 2001/0043043 A1 * | 11/2001 | Aoyama et al. ............... 313/506 |
| 2002/0040728 A1 | 4/2002 | Yoshikawa |
| 2002/0108649 A1 | 8/2002 | Fujimori et al. |
| 2002/0197460 A1 | 12/2002 | Kaneko et al. |
| 2003/0013008 A1 | 1/2003 | Ono |
| 2003/0015234 A1 | 1/2003 | Yasuno |
| 2003/0030052 A1 | 2/2003 | Oka et al. |
| 2003/0041893 A1 | 3/2003 | Shimakawa et al. |
| 2003/0079771 A1 | 5/2003 | Sano et al. |
| 2003/0127967 A1 | 7/2003 | Tsutsui et al. |
| 2003/0164188 A1 | 9/2003 | Murai et al. |
| 2003/0189401 A1 | 10/2003 | Kido et al. |
| 2003/0205268 A1 | 11/2003 | Nakamura et al. |
| 2003/0214246 A1 | 11/2003 | Yamazaki |
| 2003/0234609 A1 | 12/2003 | Aziz et al. |
| 2004/0084080 A1 | 5/2004 | Sager et al. |
| 2004/0118448 A1 | 6/2004 | Scher et al. |
| 2005/0012021 A1 | 1/2005 | Middelman et al. |
| 2005/0022864 A1 | 2/2005 | Fujioka et al. |
| 2005/0070107 A1 | 3/2005 | Shinohara |
| 2005/0084712 A1 | 4/2005 | Kido et al. |
| 2005/0084713 A1 | 4/2005 | Kido et al. |
| 2005/0098207 A1 | 5/2005 | Matsumoto et al. |
| 2005/0106419 A1 | 5/2005 | Endoh et al. |
| 2005/0170208 A1 | 8/2005 | Yatsunami et al. |
| 2005/0248267 A1 | 11/2005 | Gyoutoku et al. |
| 2005/0284518 A1 | 12/2005 | Yamada et al. |
| 2006/0008740 A1 | 1/2006 | Kido et al. |
| 2006/0065299 A1 | 3/2006 | Fukawa et al. |
| 2006/0076050 A1 | 4/2006 | Williams et al. |
| 2006/0118166 A1 | 6/2006 | Iwaki |
| 2006/0213550 A1 | 9/2006 | Yamazaki et al. |
| 2006/0214158 A1 | 9/2006 | Hirakata et al. |
| 2007/0007516 A1 | 1/2007 | Seo et al. |
| 2007/0008257 A1 | 1/2007 | Seo et al. |
| 2007/0017571 A1 | 1/2007 | Gaudiana et al. |
| 2007/0020526 A1 | 1/2007 | Gaudiana et al. |
| 2007/0131270 A1 | 6/2007 | Gaudiana et al. |
| 2007/0181179 A1 | 8/2007 | Brabec et al. |
| 2007/0193621 A1 | 8/2007 | Brabec et al. |
| 2007/0193622 A1 | 8/2007 | Sai |

(56) References Cited

U.S. PATENT DOCUMENTS

| | | |
|---|---|---|
| 2007/0200125 A1 | 8/2007 | Ikeda et al. |
| 2007/0246094 A1 | 10/2007 | Brabec et al. |
| 2007/0267055 A1 | 11/2007 | Gaudiana et al. |
| 2007/0272296 A1 | 11/2007 | Brabec et al. |
| 2007/0277874 A1 | 12/2007 | Dawson-Elli et al. |
| 2007/0277875 A1 | 12/2007 | Gadkaree et al. |
| 2008/0000518 A1 | 1/2008 | Basol |
| 2008/0006324 A1 | 1/2008 | Berke et al. |
| 2008/0087324 A1 | 4/2008 | Gaudiana et al. |
| 2008/0121281 A1 | 5/2008 | Gaudiana et al. |
| 2008/0136325 A1* | 6/2008 | Yamazaki et al. ............ 313/506 |
| 2008/0245406 A1 | 10/2008 | Yamazaki et al. |
| 2008/0251126 A1 | 10/2008 | Yamazaki et al. |
| 2009/0117680 A1 | 5/2009 | Yamazaki et al. |
| 2009/0120498 A1 | 5/2009 | Yamazaki et al. |
| 2009/0139558 A1 | 6/2009 | Yamazaki et al. |
| 2009/0142908 A1 | 6/2009 | Isaka et al. |
| 2009/0165854 A1 | 7/2009 | Yamazaki et al. |
| 2009/0236496 A1* | 9/2009 | Tanada et al. ................ 250/206 |
| 2009/0242018 A1 | 10/2009 | Ahn et al. |
| 2010/0180944 A1 | 7/2010 | Gaudiana et al. |
| 2010/0207518 A1 | 8/2010 | Ikeda et al. |
| 2010/0243058 A1 | 9/2010 | Meguro et al. |
| 2011/0000545 A1 | 1/2011 | Nishi et al. |
| 2011/0041910 A1 | 2/2011 | Shimomura et al. |
| 2011/0092013 A1 | 4/2011 | Isaka et al. |
| 2011/0132449 A1 | 6/2011 | Ramadas et al. |
| 2012/0211065 A1 | 8/2012 | Yamazaki et al. |
| 2012/0211067 A1 | 8/2012 | Yamazaki et al. |
| 2012/0211081 A1 | 8/2012 | Yamazaki et al. |
| 2012/0234392 A1 | 9/2012 | Asami et al. |
| 2013/0020568 A1 | 1/2013 | Yamazaki |
| 2013/0056715 A1* | 3/2013 | Asami et al. .................... 257/40 |

FOREIGN PATENT DOCUMENTS

| | | |
|---|---|---|
| JP | 62-171172 | 7/1987 |
| JP | 63-157483 | 6/1988 |
| JP | 01-227307 | 9/1989 |
| JP | 03-274695 | 12/1991 |
| JP | 04-130671 | 5/1992 |
| JP | 07-130661 | 5/1995 |
| JP | 07-263731 | 10/1995 |
| JP | 08-078329 | 3/1996 |
| JP | 09-063771 | 3/1997 |
| JP | 10-093122 | 4/1998 |
| JP | 10-135497 | 5/1998 |
| JP | 10-335683 | 12/1998 |
| JP | 11-040832 | 2/1999 |
| JP | 11-307259 | 11/1999 |
| JP | 11-307264 | 11/1999 |
| JP | 2000-150940 | 5/2000 |
| JP | 2000-294754 | 10/2000 |
| JP | 2000-315580 | 11/2000 |
| JP | 2001-028452 | 1/2001 |
| JP | 2001-068709 | 3/2001 |
| JP | 2001-077044 | 3/2001 |
| JP | 2001-267598 | 9/2001 |
| JP | 2001-308354 | 11/2001 |
| JP | 2002-348198 | 12/2002 |
| JP | 2003-017723 | 1/2003 |
| JP | 2003-324188 | 11/2003 |
| JP | 2004-014958 | 1/2004 |
| JP | 2004-079934 | 3/2004 |
| JP | 2004-087667 | 3/2004 |
| JP | 2004-165516 | 6/2004 |
| JP | 2004-214300 | 7/2004 |
| JP | 2004-342678 | 12/2004 |
| JP | 2005-026121 | 1/2005 |
| JP | 2005-032618 | 2/2005 |
| JP | 2005-109360 | 4/2005 |
| JP | 2005-251587 | 9/2005 |
| JP | 2005-268682 | 9/2005 |
| JP | 2006128097 A * | 5/2006 |
| JP | 2009-004184 | 1/2009 |
| JP | 2009-044184 | 2/2009 |
| WO | WO-2006/025260 A1 | 3/2006 |

OTHER PUBLICATIONS

Nomura. K et al., "Thin-Film Transistor Fabricated in Single-Crystalline Transparent Oxide Semiconductor,", Science, May 23, 2003, vol. 300, No. 5623, pp. 1269-1272.

Zhang. S et al., "A phenomenological model for systematization and prediction of doping limits in II-VI and I-III-VI2 compounds,", J. Appl. Phys. ( Journal of Applied Physics ), Mar. 15, 1998, vol. 83, No. 6, pp. 3192-3196.

Graf M, "The ULE2 ion source capabilities important to SOI technology,", IIT 1998:1998 International Conference on Ion Implantation Technology, Jun. 22, 1998, vol. 1, pp. 308-311.

Hiramoto M et al., "Three-layered organic solar cell with a photoactive interlayer of codeposited pigments,", Appl. Phys. Lett. ( Applied Physics Letters ), Mar. 11, 1991, vol. 58, No. 10, pp. 1062-1064.

* cited by examiner

PHOTOELECTRIC CONVERSION DEVICE

BACKGROUND OF THE INVENTION

1. Field of the Invention

The present invention relates to a photoelectric conversion device in which a semiconductor including an organic material is used.

2. Description of the Related Art

As a photoelectric conversion device which converts an optical energy into an electrical energy, a crystalline silicon solar cell such as a single crystalline silicon solar cell or a polycrystalline silicon solar cell, an amorphous silicon solar cell, and a compound semiconductor solar cell including CIGS ($Cu(In,Ga)Se_2$) and the like have been known. Although these solar cells are being widely used, there are still many problems in terms of cost and the like; thus, a solar cell that can be manufactured at low cost is desired. As one of solutions, a solar cell including an organic semiconductor has been suggested.

In addition to a dye-sensitized solar cell, a thin-film type solar cell has been known as an organic semiconductor solar cell. There is a thin-film type solar cell having a p-i-n junction structure, which includes phthalocyanine ($H_2PC$) that shows p-type semiconductor characteristics, a perylene pigment (Me-PTC) that shows n-type semiconductor characteristics, and a codeposited layer of the both (see Non-Patent Document 1). The thin-film type solar cell does not need such an electrolyte that is used in a dye-sensitized solar cell; therefore, there is an advantage that the productivity and long-term reliability can be controlled easily.

REFERENCE

[Non-Patent Document 1] M. Hiramoto, H. Fujiwara, M. Yokoyama, "Three-layered organic solar cell with a photoactive interlayer of codeposited pigments", Appl. Phys. Lett., 58, 1062-1064 (1991).

SUMMARY OF THE INVENTION

However, a thin-film type solar cell including an organic material has a problem in that the conversion efficiency thereof is lower than that of a silicon solar cell or a solar cell of another compound semiconductor.

Light loss caused by light absorption in a window layer can be given as one of the reasons that the conversion efficiency of the thin-film type solar cell does not improve. Although an exciton is generated also in the window layer by light absorption, the diffusion length thereof in an organic semiconductor is extremely short and thus the exciton is deactivated easily before reaching a junction. In other words, the light absorbed by the window layer is not substantially used; therefore, it is preferable to form the window layer with a material having a high light-transmitting property.

A conventional organic semiconductor used for a window layer has high resistance; therefore, the film thickness has needed to be small. Thus, there has been a problem in that a short circuit between upper and lower electrodes is likely to be caused by particles or the like.

Thus, an object of one embodiment of the present invention is to provide a photoelectric conversion device which has little light loss caused by light absorption in the window layer. Another object thereof is to provide a photoelectric conversion device in which a short circuit between upper and lower electrodes is less likely to be caused.

One embodiment of the present invention disclosed in this specification is a photoelectric conversion device including a p-type light-transmitting semiconductor layer which is formed using an organic compound and an inorganic compound as a window layer.

According to one embodiment of the present invention disclosed in this specification, a photoelectric conversion device includes a first electrode, a first semiconductor layer formed over the first electrode, a second semiconductor layer formed over the first semiconductor layer, a third semiconductor layer formed over the second semiconductor layer, and a second electrode formed over the third semiconductor layer; and the first semiconductor layer is a light-transmitting semiconductor layer containing an organic compound and an inorganic compound, and the second semiconductor layer and the third semiconductor layer are each a semiconductor layer containing an organic compound.

Note that in this specification and the like, ordinal numbers such as "first" and "second" are used in order to avoid confusion among components, and do not limit the order or number of the components.

In the above structure, the first semiconductor layer can have p-type conductivity, the second semiconductor layer can have i-type conductivity, and the third semiconductor layer can have n-type conductivity.

According to another embodiment of the present invention disclosed in this specification, a photoelectric conversion device includes a first electrode, a first semiconductor layer formed over the first electrode, a second semiconductor layer formed over the first semiconductor layer, a third semiconductor layer formed over the second semiconductor layer, a fourth semiconductor layer formed over the third semiconductor layer, and a second electrode formed over the fourth semiconductor layer; and the first semiconductor layer is a light-transmitting semiconductor layer containing an organic compound and an inorganic compound, and the second semiconductor layer, the third semiconductor layer, and the fourth semiconductor layer are each a semiconductor layer containing an organic compound.

In the above structure, the first semiconductor layer and the second semiconductor layer each can have p-type conductivity, the third semiconductor layer can have i-type conductivity, and the fourth semiconductor layer can have n-type conductivity.

Further, as the organic compound for forming the first semiconductor layer, any of an aromatic amine compound, a carbazole derivative, aromatic hydrocarbon, a high molecular compound, and a heterocyclic compound having a dibenzofuran skeleton or a dibenzothiophene skeleton can be used.

Furthermore, as the inorganic compound for forming the first semiconductor layer, any of a vanadium oxide, a niobium oxide, a tantalum oxide, a chromium oxide, a molybdenum oxide, a tungsten oxide, a manganese oxide, a rhenium oxide, and a titanium oxide can be used.

According to one embodiment of the present invention, a photoelectric conversion device which can reduce the light loss caused by light absorption in a window layer and has high conversion efficiency can be provided. Further, a photoelectric conversion device in which a short circuit between upper and lower electrodes is less likely to be caused can be provided.

DETAILED DESCRIPTION OF THE INVENTION

Embodiments of the present invention will be described below in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

In this embodiment, a photoelectric conversion device according to one embodiment of the present invention will be described.

Note that in this specification, an n-type semiconductor is a semiconductor having characteristics as an electron donor, and a p-type semiconductor is a semiconductor having characteristics as an electron acceptor. Both of the semiconductors contain an organic material.

Figure 1A:
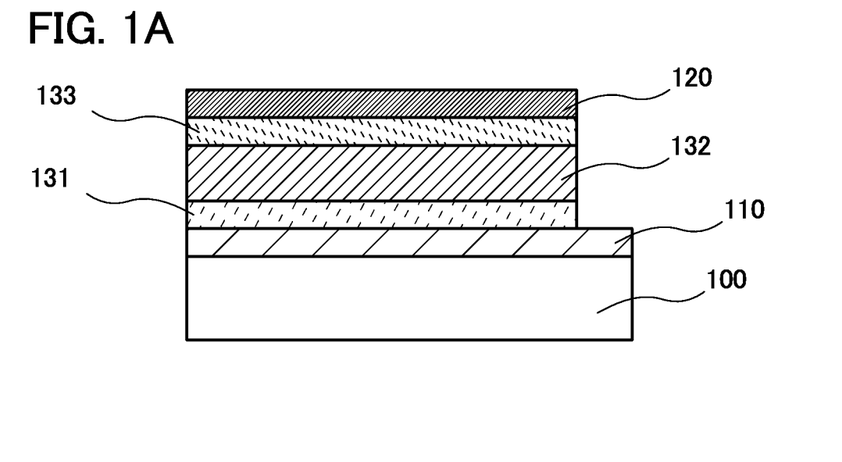
FIGS. 1A and 1B are cross-sectional views each illustrating a photoelectric conversion device according to one embodiment of the present invention.

FIG. 1A is an example of a cross-sectional view of a photoelectric conversion device according to one embodiment of the present invention. The photoelectric conversion device includes, over a light-transmitting substrate 100, a first electrode 110, a first semiconductor layer 131, a second semiconductor layer 132, a third semiconductor layer 133, and a second electrode 120. As the light-transmitting substrate 100, for example, a glass substrate can be used.

Although, in this embodiment, an example in which a light-transmitting conductive film is used for the first electrode 110 and a surface on the substrate 100 side serves as a light-receiving plane is described, a surface on the second electrode 120 side can serve as a light-receiving plane when a light-transmitting conductive film is used for the second electrode 120. When the first electrode 110 and the second electrode 120 are both formed using a light-transmitting conductive film, both of the surfaces can serve as a light-receiving plane. Note that when only the second electrode 120 side serves as a light-receiving plane, the substrate 100 does not necessarily have a light-transmitting property.

Figure 2:
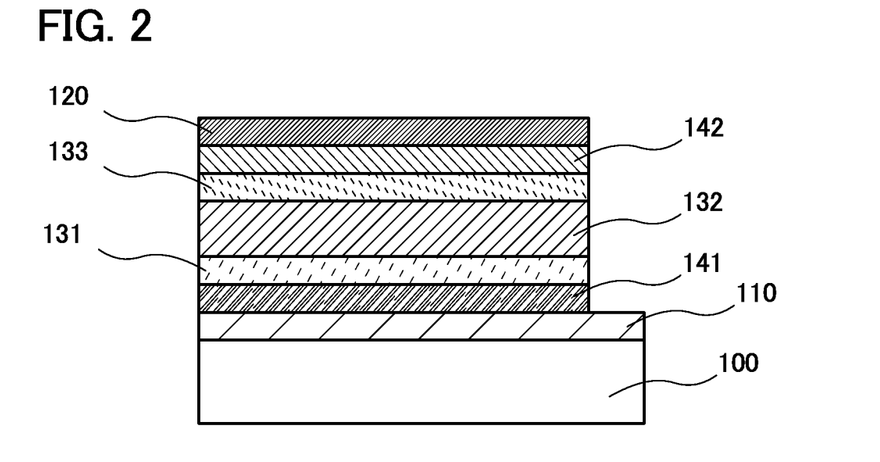
FIG. 2 is a cross-sectional view illustrating a photoelectric conversion device according to one embodiment of the present invention.

Without limitation to the structure illustrated in FIG. 1A, the first semiconductor layer 131 and the third semiconductor layer 133 may be interchanged with each other. Further, as illustrated in FIG. 2, a first buffer layer 141 may be provided between the first electrode 110 and the first semiconductor layer 131, and a second buffer layer 142 may be provided between the second electrode 120 and the third semiconductor layer 133. The buffer layer is effective in improving contact characteristics between the semiconductor layer and the electrode, and a metal oxide such as a zinc oxide, a nickel oxide, or a molybdenum oxide or a conductive macromolecule such as polyethylenedioxythiophene/polystyrenesulfonic acid (abbreviation: PEDOT/PSS), which has conductivity or semiconductor characteristics, can be used. Note that at least one of the first buffer layer 141 and the second buffer layer 142 may be provided. Further, the materials of the first buffer layer 141 and the second buffer layer 142 may be different from each other.

Figure 1B:
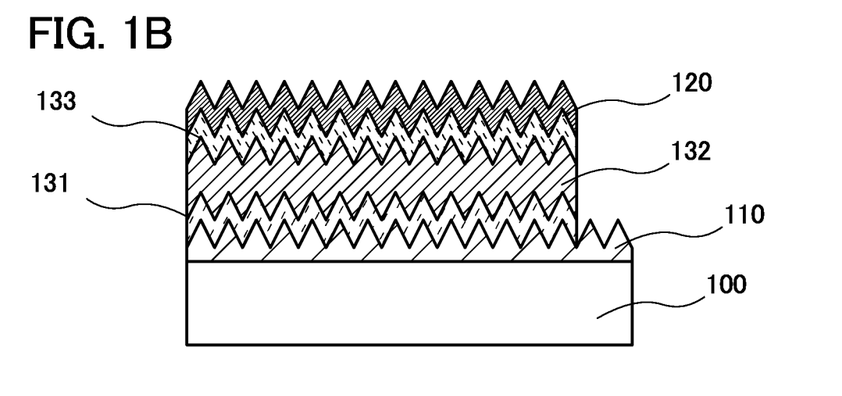

FIG. 1B illustrates an example in which a surface of the first electrode 110 is processed to have unevenness. The first semiconductor layer 131, the second semiconductor layer 132, the third semiconductor layer 133, and the second electrode 120 reflect the unevenness of the surface of the first electrode 110 as illustrated in FIG. 1B. On the surface processed to have unevenness, multiply-reflected light is incident, and the light obliquely propagates into a photoelectric conversion region; thus, the light pass length is increased. In addition, a so-called light trapping effect in which reflected light by the rear surface is totally reflected at the surface can occur.

Note that for the light-transmitting conductive film, the following can be used: an indium tin oxide, an indium tin oxide containing silicon, an indium oxide containing zinc, a zinc oxide, a zinc oxide containing gallium, a zinc oxide containing aluminum, a tin oxide, a tin oxide containing fluorine, a tin oxide containing antimony, graphene, or the like. The light-transmitting conductive film is not limited to a single layer, and may have a layered structure of different films.

The first semiconductor layer 131 can be formed using a light-transmitting semiconductor layer having p-type conductivity. The light-transmitting semiconductor layer according to one embodiment of the present invention is a composite material of an inorganic compound and an organic compound.

It is possible to use, as the inorganic compound, a transition metal oxide whose band gap is greater than or equal to 2 eV, preferably greater than or equal to 3 eV. It is particularly preferable that the inorganic compound be an oxide of a metal belonging to any of Group 4 to Group 8 in the periodic table.

For example, as the inorganic compound, a vanadium oxide, a niobium oxide, a tantalum oxide, a chromium oxide, a molybdenum oxide, a tungsten oxide, a manganese oxide, a rhenium oxide, or a titanium oxide can be used. Among these, a molybdenum oxide is particularly preferable because of its stability in the air, low hygroscopic property, and easiness to be treated.

As the organic compound, a material whose band gap is greater than or equal to 2 eV, preferably greater than or equal to 3 eV, is used.

The organic compound preferably has a high hole-transport property. Specifically, a substance having a hole mobility higher than or equal to $10^{-6}$ cm$^2$/Vs is preferably used. Note that other than the above substance, any substance that has a property of transporting more holes than electrons may be used.

For example, as the organic compound, any of a variety of compounds such as an aromatic amine compound, a carbazole derivative, an aromatic hydrocarbon, a high molecular compound (e.g., an oligomer, a dendrimer, or a polymer), and a heterocyclic compound having a dibenzofuran skeleton or a dibenzothiophene skeleton can be used.

With the use of the inorganic compound and organic compound described above, a composite material having a high light-transmitting property can be formed.

The transition metal oxide has an electron-accepting property; thus, a composite material of an organic compound having a high hole-transport property and such a transition metal has high carrier density and exhibits p-type semiconductor characteristics. Further, the composite material has high transmittance of light in a wide wavelength range from visible light region to infrared region. Furthermore, the refractive index of the composite material is close to that of a light-transmitting conductive film such as an indium tin oxide film, so that it is possible to use the composite material as an anti-reflection film by adjusting the film thickness as appropriate.

The composite material can be formed by a codeposition method. Further, it is also possible to use a coating method, a sol-gel method, or the like. By increasing a mol rate of the inorganic compound to the organic compound, an absorbance in the charge transfer region increases. That is, more molecules tend to be excited; however, a charge-transport property also depends on the combination of an organic compound and an inorganic compound. Therefore, the mol rate is to be determined as appropriate. The thickness of the composite material is preferably 1 nm to 50 nm.

In a conventional photoelectric conversion device including an organic semiconductor, for example, phthalocyanine having insufficient transmittance is used for a window layer; thus, the light loss caused by light absorption in the window layer occurs. On the other hand, according to one embodiment of the present invention, the composite material having a light-transmitting property is used for a window layer, whereby the light loss caused by light absorption in the window layer can be reduced, and photoelectric conversion can be efficiently performed in a light absorption region.

Figure 3:
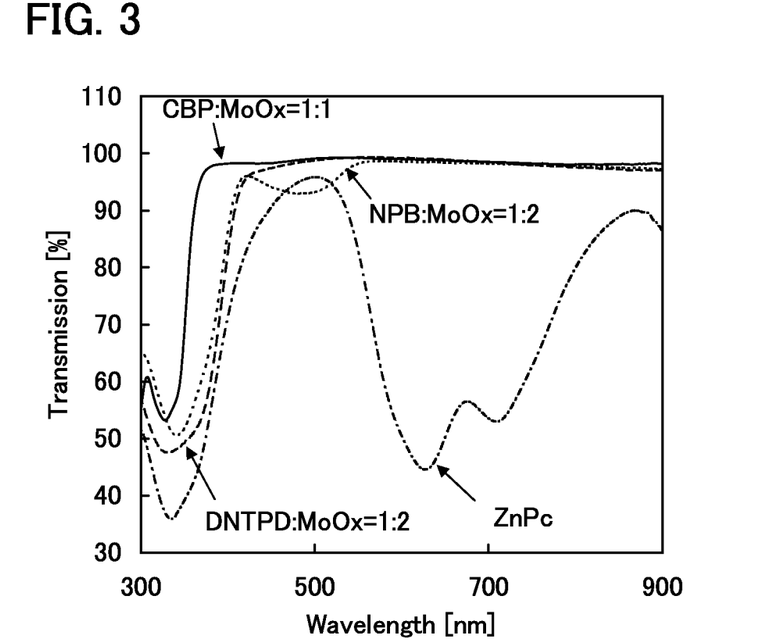
FIG. 3 is a graph comparing a transmittance of a conventional material for a window layer with a transmittance of a material for a window layer according to one embodiment of the present invention.

FIG. 3 shows results obtained by comparing transmittance of zinc phthalocyanine (ZnPc) which is an example of a conventional material for a window layer with transmittance of each of composite materials of an inorganic compound and an organic compound according to one embodiment of the present invention, which are a composite material of 4,4'-di(N-carbazolyl)biphenyl (abbreviation: CBP) and a molybdenum oxide (the mixture ratio: CBP:molybdenum oxide=1:1), a composite material of 4,4'-bis(N-{4-[N'-(3-methylphenyl)-N'-phenylamino]phenyl}-N-phenylamino)biphenyl (abbreviation: DNTPD) and a molybdenum oxide (the mixture ratio: DNTPD:molybdenum oxide=1:2), and a composite material of 4,4'-bis[N-(1-naphthyl)-N-phenylamino]biphenyl (abbreviation: NPB) and a molybdenum oxide (the mixture ratio: NPB:molybdenum oxide=1:2). The composite material of an inorganic compound and an organic compound according to one embodiment of the present invention has much higher transmittance than zinc phthalocyanine which is an example of a conventional material for a window layer, which suggests that the light loss caused by light absorption in the window layer can be reduced. Since the composite material has high transmittance of light in a wide wavelength range, the first semiconductor layer 131 can be formed thick, whereby the resistance in the horizontal direction can be reduced and a short circuit in a vertical direction which is caused between, for example, upper and lower electrodes can be prevented. Further, in the case where the composite material is used as the window layer, the buffer layer in contact with the window layer, which is illustrated in FIG. 2, can be omitted because the window layer has low contact resistance with the first electrode.

The third semiconductor layer 133 can be formed using a semiconductor layer having n-type conductivity. The third semiconductor layer 133 is preferably formed with a thickness of 10 nm to 50 nm by a codeposition method, a coating method, a sol-gel method, or the like as appropriate. An organic compound having an electron-transport property is preferably used for the third semiconductor layer 133, and more preferably, a chelate metal complex having a chelate ligand containing an aromatic ring, an organic compound having a phenanthroline skeleton, an organic compound having an oxadiazole skeleton, a perylene derivative, a naphthalene derivative, quinones, methyl viologen, fullerene, and the like are used. Specifically, there are tris(8-quinolinolato)aluminum (abbreviation: $Alq_3$), tris(4-methyl-8-quinolinolato)aluminum (abbreviation: $Almq_3$), bis(10-hydroxybenzo[h]quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproine (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), phenyl-$C_{61}$ butyric acid methyl ester (abbreviation: PCBM), naphthalen-2,3,6,7-tetracarboxylicdianhydride (abbreviation: NTCDA), and the like. Note that the present invention is not limited to these. Further, among the above compounds, a perylene derivative, a naphthalene derivative, quinones, methyl viologen, fullerene, and the like easily generate electron carriers, and are a suitable compound group for the third semiconductor layer 133.

The second semiconductor layer 132 can be formed using a semiconductor layer having i-type conductivity. The second semiconductor layer 132 can be formed by a codeposition method with the above organic semiconductor material having n-type conductivity and an organic semiconductor material having p-type conductivity. The second semiconductor layer 132 is preferably formed with a thickness of 1 nm to 1000 nm.

As a typical organic semiconductor material having p-type conductivity, the following materials can be given: phthalocyanine (abbreviation: $H_2Pc$), copper phthalocyanine (abbreviation: CuPc), zinc phthalocyanine (abbreviation: ZnPc), tin phthalocyanine (SnPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), poly-ethylenedioxythiophene/polystyrenesulfonic acid (abbreviation: PEDOT/PSS), poly(3-hexylthiophene) (abbreviation: P3HT), poly[2,1,3-benzothiadiazole-4,7-diyl-2,5-thiophenediyl(1-dodecyl-1H-pyrrole-2,5-diyl)-2,5-thiophenediyl] (abbreviation: PTPTB), poly{2,1,3-benzothiadiazole-4,7-diyl[4,4-bis(2-ethylhexyl)-4H-cyclopenta[2,1-b:3,4-b']dithiophen-2,6-diyl]} (abbreviation: PCPTBT), poly[2-methoxy-5-(3,7-dimethyloctyloxy)-1,4-phenylenevinylene] (abbreviation: MDMO-PPV), ammonium perfluorooctanoate (abbreviation: APFO), an alternating copolymer of thienothiophene and benzothiophene, and the like. Note that the present invention is not limited to these. Among the above compounds, an aromatic amine compound typified by TDATA, MTDATA, m-MTDAB, TPD, NPB, DNTPD, TCTA, and the like easily generates a hole carrier and is preferable to be used as the organic semiconductor material having p-type conductivity.

A p-i-n junction can be formed with the above first semiconductor layer 131, second semiconductor layer 132, and third semiconductor layer 133. Further, the third semiconductor layer 133, which is a semiconductor layer having i-type conductivity that is obtained by a mixture of the semiconductor layer having n-type conductivity and the semiconductor layer having p-type conductivity, contributes to photoelectric conversion as a light-absorbing layer.

A low-resistance metal such as silver, aluminum, or copper can be used for the second electrode 120 and can be formed by a sputtering method, a vacuum evaporation method, or the like. Alternatively, the second electrode 120 may be formed using a conductive resin such as a silver paste or a copper paste by a screen printing method. As described above, the second electrode 120 can also be formed using a light-transmitting conductive film.

Figure 4:
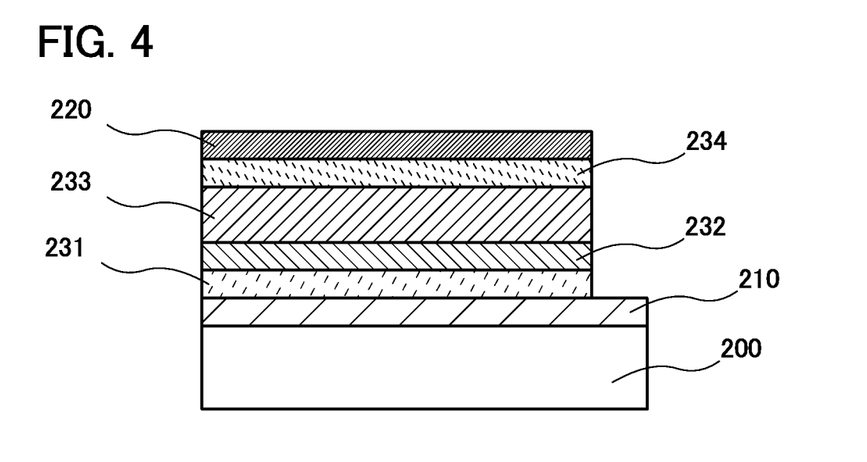
FIG. 4 is a cross-sectional view illustrating a photoelectric conversion device according to one embodiment of the present invention.

Note that the semiconductor layer having p-type conductivity that serves as a window layer may have a two-layer structure as illustrated in FIG. 4. The photoelectric conversion device illustrated in FIG. 4 includes, over a light-transmitting substrate 200, a first electrode 210, a first semiconductor layer 231, a second semiconductor layer 232, a third semiconductor layer 233, a fourth semiconductor layer 234, and a second electrode 220.

For the substrate 200, the first electrode 210, the first semiconductor layer 231, and the second electrode 220, the same materials as the substrate 100, the first electrode 110, the first semiconductor layer 131, and the second electrode 120 described in the structures of FIGS. 1A and 1B can be used, respectively.

Further, the third semiconductor layer 233 can be formed using the same material as the second semiconductor layer 132 described in the structures of FIGS. 1A and 1B, and the fourth semiconductor layer 234 can be formed using the same material as the third semiconductor layer 133 described therein.

The second semiconductor layer 232 includes an organic compound which exhibits p-type semiconductor characteristics, and any of the above materials which are given as examples of the organic semiconductor material having p-type conductivity can be used.

In such a manner, a process for forming a two-layer semiconductor layer having p-type conductivity that serves as a window layer can reduce the probability that a pinhole might be caused and a defect such as a short circuit between upper and lower electrodes. Note that the structure of the photoelectric conversion device of FIG. 4 can also be combined with the structure of the photoelectric conversion device of FIG. 1B and/or the structure of the photoelectric conversion device of FIG. 2.

With the above structure, a photoelectric conversion device in which the amount of light loss caused by light absorption in a window layer is small and a short circuit between upper and lower electrodes is unlikely to occur can be provided.

This embodiment can be freely combined with any of the other embodiments.

Embodiment 2

In this embodiment, the light-transmitting semiconductor layer described in Embodiment 1 will be described.

For the light-transmitting semiconductor layer (first semiconductor layer 131) in any of the photoelectric conversion devices described in Embodiment 1, a composite material of a transition metal oxide and an organic compound can be used. Note that in this specification, the word "composite" means not only a state in which two materials are simply mixed but also a state in which a plurality of materials is mixed and charges are transferred between the materials.

As the transition metal oxide, a transition metal oxide having an electron-accepting property can be used. Among transition metal oxides, an oxide of a metal belonging to any of Groups 4 to 8 of the periodic table, whose band gap is greater than or equal to 2 eV, preferably greater than or equal to 3 eV, is used.

For example, as the transition metal oxide, a vanadium oxide, a niobium oxide, a tantalum oxide, a chromium oxide, a molybdenum oxide, a tungsten oxide, a manganese oxide, a rhenium oxide, or a titanium oxide which has high electron-accepting property can be used. Among these, a molybdenum oxide is particularly preferable because of its stability in the air, low hygroscopic property, and easiness to be treated.

It is preferable to use, for the organic compound, a material whose band gap (a difference between the highest occupied molecular orbital (HOMO level) and the lowest unoccupied molecular orbital level (LUMO level)) is greater than or equal to 2 eV, preferably greater than or equal to 3 eV.

The organic compound preferably has a high hole-transport property. Specifically, a substance having a hole mobility higher than or equal to $10^{-6}$ cm$^2$/Vs is preferably used. Note that other than the above substance, any substance that has a property of transporting more holes than electrons may be used.

For example, as the organic compound, any of a variety of compounds such as an aromatic amine compound, a carbazole derivative, an aromatic hydrocarbon, a high molecular compound (e.g., an oligomer, a dendrimer, or a polymer), and a heterocyclic compound having a dibenzofuran skeleton or a dibenzothiophene skeleton can be used.

With the use of the inorganic compound and organic compound described above, a composite material having a high light-transmitting property can be formed.

In a composite material of the above-described transition metal oxide and the above-described organic compound, electrons in the highest occupied molecular orbital level (HOMO level) of the organic compound are transferred to the conduction band of the transition metal oxide, whereby interaction between the transition metal oxide and the organic compound occurs. Due to this interaction, the composite material including the transition metal oxide and the organic compound has high carrier concentration and has p-type semiconductor characteristics.

The organic compounds which can be used for the composite material will be specifically enumerated below.

As the aromatic amine compounds that can be used for the composite material, the following can be given as examples: 4,4'-bis[N-(1-naphthyl)-N-phenylamino]biphenyl (abbreviation: NPB); N,N'-bis(3-methylphenyl)-N,N'-diphenyl-[1,1'-biphenyl]-4,4'-diamine (abbreviation: TPD); 4,4',4"-tris(N, N-diphenylamino)triphenylamine (abbreviation: TDATA); 4,4',4"-tris[N-(3-methylphenyl)-N-phenylamino]triphenylamine (abbreviation: MTDATA); and N,N'-bis(spiro-9,9'-bifluoren-2-yl)-N,N'-diphenylbenzidine (abbreviation: BSPB). In addition, the following can be given: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis{4-[bis(3-methylphenyl)amino]phenyl}-N,N'-diphenyl-(1,1'-biphenyl)-4,4'-diamine (abbreviation: DNTPD); 1,3,5-tris[N-(4-diphenylaminophenyl)-N-phenylamino]benzene (abbreviation: DPA3B); 4-phenyl-4'-(9-phenylfluoren-9-yl)

triphenylamine (abbreviation: BPAFLP); 4,4'-bis[N-(9,9-dimethylfluoren-2-yl)-N-phenylamino]biphenyl (abbreviation: DFLDPBi); and 4,4'-bis[N-(spiro-9,9'-bifluoren-2-yl)-N-phenylamino]biphenyl (abbreviation: BSPB).

As carbazole derivatives which can be used for the composite material, the following can be given as specific examples: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1).

Moreover, as another carbazole derivative which can be used for the composite material, 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)phenyl]-10-phenylanthracene (abbreviation: CzPA), 1,4-bis[4-(N-carbazolyl)phenyl]-2,3,5,6-tetraphenylbenzene, or the like can be used.

As aromatic hydrocarbon that can be used for the composite material, the following can be given as examples: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides those, pentacene, coronene, or the like can also be used. The aromatic hydrocarbon which has a hole mobility higher than or equal to $1\times10^{-6}$ cm$^2$/Vs and which has 14 to 42 carbon atoms is particularly preferable.

The aromatic hydrocarbon which can be used for the composite material may have a vinyl skeleton. As the aromatic hydrocarbon having a vinyl group, the following are given as examples: 4,4'-bis(2,2-diphenylvinyl)biphenyl (abbreviation: DPVBi) and 9,10-bis[4-(2,2-diphenylvinyl)phenyl]anthracene (abbreviation: DPVPA).

The organic compound used for the composite material may be a heterocyclic compound having a dibenzofuran skeleton or a dibenzothiophene skeleton.

The organic compound that can be used for the composite material may be a high molecular compound, and the following can be given as examples: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide] (abbreviation: PTPDMA); and poly[N,N'-bis(4-butylphenyl)-N,N'-bis(phenyl)benzidine] (abbreviation: Poly-TPD).

A variety of methods can be used for forming the light-transmitting semiconductor layer, whether the method is a dry process or a wet process. As a dry method, a codeposition method, by which a plurality of evaporation materials is vaporized from a plurality of evaporation sources to perform deposition, is given as an example. As a wet method, a composition having a composite material is adjusted by a sol-gel method or the like, and deposition can be performed using an ink-jet method or a spin-coating method.

When the above-described light-transmitting semiconductor layer is used for a window layer of a photoelectric conversion device, the light loss caused by light absorption in the window layer is reduced, and the electric characteristics of the photoelectric conversion device can be improved. The window layer can be formed thick because of a high light-transmitting property and low resistance, which enables a photoelectric conversion device in which a short circuit between upper and lower electrodes is unlikely to occur.

This embodiment can be freely combined with any of the other embodiments.

This application is based on Japanese Patent Application serial No. 2011-195372 filed with the Japan Patent Office on Sep. 7, 2011, the entire contents of which are hereby incorporated by reference.

What is claimed is:

1. A photoelectric conversion device comprising:
   a substrate;
   a first electrode over the substrate;
   a first light-transmitting semiconductor layer in direct contact with the first electrode;
   a second light-transmitting semiconductor layer in direct contact with the first light-transmitting semiconductor layer;
   a first semiconductor layer in direct contact with the second light-transmitting semiconductor layer;
   a second semiconductor layer in direct contact with the first semiconductor layer; and
   a second electrode in direct contact with the second semiconductor layer,
   wherein the first light-transmitting semiconductor layer includes an organic compound and an inorganic compound,
   wherein the second light-transmitting semiconductor layer includes an organic compound,
   wherein the inorganic compound is selected from a vanadium oxide, a niobium oxide, a tantalum oxide, a chromium oxide, a molybdenum oxide, a tungsten oxide, a manganese oxide, a rhenium oxide, and a titanium oxide,
   wherein the first light-transmitting semiconductor layer and the second light-transmitting semiconductor layer have p-type conductivity,
   wherein the first semiconductor layer comprises a first semiconductor material having p-type conductivity and a second semiconductor material having n-type conductivity, and
   wherein the second semiconductor layer has n-type conductivity.

2. The photoelectric conversion device according to claim 1, wherein the organic compound is selected from an aromatic amine compound, a carbazole derivative, an aromatic hydrocarbon, a high molecular compound, and a heterocyclic compound having a dibenzofuran skeleton or a dibenzothiophene skeleton.

3. A photoelectric conversion device comprising:
   a substrate;
   a first electrode over the substrate;
   a light-transmitting semiconductor layer in direct contact with the first electrode;
   a first semiconductor layer over the light-transmitting semiconductor layer;
   a second semiconductor layer in direct contact with the first semiconductor layer; and
   a second electrode in direct contact with the second semiconductor layer, wherein the light-transmitting semiconductor layer includes an organic compound and an inorganic compound, wherein the inorganic compound is selected from a vanadium oxide, a niobium oxide, a tantalum oxide, a chromium oxide, a molybdenum oxide, a tungsten oxide, a manganese oxide, a rhenium oxide, and a titanium oxide, wherein the light-transmitting semiconductor layer has p-type conductivity, wherein the first semiconductor layer comprises a first semiconductor material having p-type conductivity and a second semiconductor material having n-type conductivity, and wherein the second semiconductor layer has n-type conductivity.

4. The photoelectric conversion device according to claim 3, wherein the organic compound is selected from an aromatic amine compound, a carbazole derivative, an aromatic hydrocarbon, a high molecular compound, and a heterocyclic compound having a dibenzofuran skeleton or a dibenzothiophene skeleton.

5. The photoelectric conversion device according to claim 1, wherein the first electrode is a light-transmitting conductive film.

6. The photoelectric conversion device according to claim 3, wherein the first electrode is a light-transmitting conductive film.

7. The photoelectric conversion device according to claim 1, wherein the first semiconductor material is an organic semiconductor.

8. The photoelectric conversion device according to claim 1, wherein the second semiconductor material is an organic semiconductor.

9. The photoelectric conversion device according to claim 3, wherein the first semiconductor material is an organic semiconductor.

10. The photoelectric conversion device according to claim 3, wherein the second semiconductor material is an organic semiconductor.

* * * * *